(12) United States Patent
Oh

(10) Patent No.: US 7,574,182 B2
(45) Date of Patent: Aug. 11, 2009

(54) MOBILE COMMUNICATIONS TERMINAL HAVING DRIVING VOLTAGE CONTROL APPARATUS AND METHOD THEREOF

(75) Inventor: Jae-Hyun Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 433 days.

(21) Appl. No.: 11/373,289

(22) Filed: Mar. 13, 2006

(65) Prior Publication Data
US 2006/0202889 A1    Sep. 14, 2006

(30) Foreign Application Priority Data
Mar. 11, 2005    (KR) ............... 10-2005-0020738
Apr. 21, 2005    (KR) ............... 10-2005-0033338

(51) Int. Cl.
*H04B 1/04*    (2006.01)
*H04Q 7/20*    (2006.01)

(52) U.S. Cl. .................... 455/127.1; 455/126

(58) Field of Classification Search ............ 455/126, 455/127.1, 127.2; 330/127, 285, 297
See application file for complete search history.

(56) References Cited

U.S. PATENT DOCUMENTS

| | | | |
|---|---|---|---|
| 4,523,155 A | 6/1985 | Walczak et al. | |
| 4,636,741 A | 1/1987 | Mitzlaff | |
| 5,101,172 A | 3/1992 | Ikeda et al. | |
| 5,182,527 A | 1/1993 | Nakanishi et al. | |
| 5,604,924 A | 2/1997 | Yokoya | |
| 5,886,575 A | 3/1999 | Long | |
| 6,173,163 B1 * | 1/2001 | Northcutt | 455/126 |
| 6,639,471 B2 | 10/2003 | Matsuura et al. | |
| 2002/0186076 A1 | 12/2002 | Hareyama | |

FOREIGN PATENT DOCUMENTS

| | | |
|---|---|---|
| JP | 3-283717 A | 12/1991 |
| JP | 6-334541 A | 12/1994 |
| JP | 2690595 B2 | 12/1997 |
| JP | 2001-320288 A | 11/2001 |
| JP | 2003-8365 A | 1/2003 |
| KR | 10-2000-0046113 A | 7/2000 |
| KR | 20-0208301 Y1 | 12/2000 |
| KR | 10-0326957 B1 | 3/2002 |
| KR | 10-2002-0081069 A | 10/2002 |
| KR | 10-2004-0104921 A | 12/2004 |

OTHER PUBLICATIONS

Nojima et al., IEICE Transactions, Institute of Electronics Information and Comm. Eng. Tokyo, JP, "High Efficiency Transmitting Power Amplifiers for Portable Radio Units", vol. E74, No. 6, pp. 1563-1569, (Jun. 1, 1991).

* cited by examiner

*Primary Examiner*—Lee Nguyen
(74) *Attorney, Agent, or Firm*—Birch, Stewart, Kolasch & Birch, LLP

(57) ABSTRACT

A mobile communication terminal including a power amplifier configured to amplify a power of a received signal and wirelessly transmit the amplified signal through an antenna, a high power detector configured to determine whether the amplified power of the signal exceeds a particular critical range, a detected voltage level converter configured to convert a voltage corresponding to the output power exceeding the critical range into a voltage having a particular voltage level, and a varied driving voltage output unit configured to vary the converted voltage and apply the varied voltage to the power amplifier.

21 Claims, 6 Drawing Sheets

FIG. 4

|  | input power (dBm) | out power (dBm) | Vin(DC-DC) | Vout(DC-DC) |
|---|---|---|---|---|
| Low Power Mode | -39.8 | -30 | 0.448 | 1.36 |
|  | -34.8 | -25 | 0.448 | 1.36 |
|  | -30 | -20 | 0.449 | 1.364 |
|  | -25.2 | -15 | 0.451 | 1.368 |
|  | -22.1 | -10 | 0.493 | 1.469 |
|  | -17.6 | 5 | 0.569 | 1.724 |
|  | -12.8 | 0 | 0.658 | 1.996 |
|  | -8.5 | 5 | 0.738 | 2.237 |
| High Power Mode | -15.7 | 6 | 0.755 | 2.289 |
|  | -14.7 | 7 | 0.773 | 2.343 |
|  | -13.7 | 8 | 0.792 | 2.4 |
|  | -12.9 | 9 | 0.807 | 2.446 |
|  | -12 | 10 | 0.826 | 2.501 |
|  | -11.1 | 11 | 0.843 | 2.555 |
|  | -10.2 | 12 | 0.86 | 2.607 |
|  | -9.3 | 13 | 0.877 | 2.658 |
|  | -8.4 | 14 | 0.895 | 2.709 |
|  | -7.5 | 15 | 0.912 | 2.764 |
|  | -6.7 | 16 | 0.93 | 2.817 |
|  | -5.8 | 17 | 0.949 | 2.876 |
|  | -4.9 | 18 | 0.969 | 2.926 |
|  | -4 | 19 | 0.986 | 2.997 |
|  | -3.1 | 20 | 1.009 | 3.052 |
|  | -2.2 | 21 | 1.024 | 3.107 |
|  | -1.2 | 22 | 1.048 | 3.174 |
|  | -0.2 | 23 | 1.069 | 3.234 |
|  | 0.9 | 24 | 1.09 | 3.297 |
|  | 2 | 25 | 1.111 | 3.585 |
|  | 3.3 | 26 | 1.129 | 3.545 |
|  | 5.5 | 27 | 1.151 | 3.49 |
|  | 11 | 28 | 1.171 | 3.409 |

FIG. 5

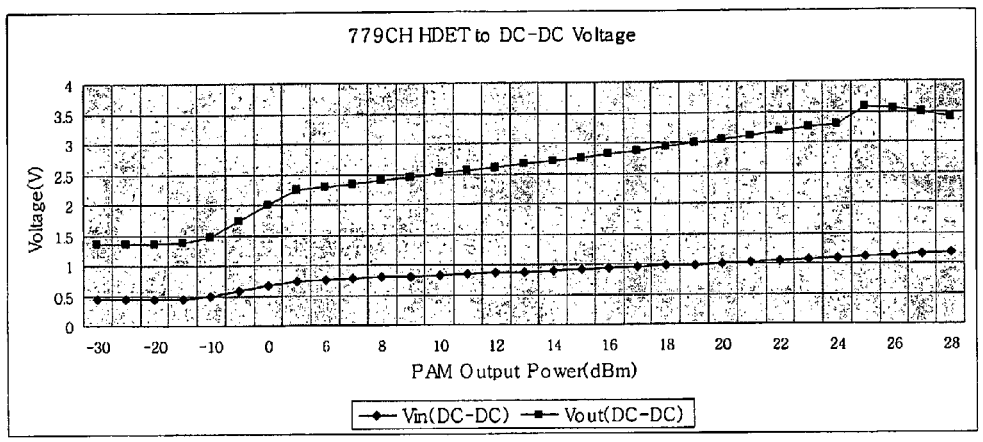

FIG. 6

| condition | Vcc : 3.4V<br>Vcontrol : 2.85V(Low Power Mode)<br>Vref : 2.85V<br>current consumption : 64mA ~ 69mA<br>Input Power : -5dBm | Vadj : 0.5V → Vcc : 1.7V<br>Vcontrol : 0V<br>Vref : 2.85V<br>current consumption : 64mA ~ 69mA<br>Input Power : -5dBm |
|---|---|---|
| 779Ch | 779Ch<br>15.9dBm = 38.9mW<br>-5dBm = 3.16mW<br>DC power= 64*3.4V = 217.6mW<br>PAE = {(38.9mW + 3.16mW)/217.6mW}<br>* 100 = 19.32% | 779Ch<br>16.32dBm = 42.85mW<br>-5dBm = 3.16mW<br>DC power = 64*1.7V = 108.8mW<br>PAE = {(42.85mW + 3.16mW)/108.8mW}<br>* 100 = 42.29% |
| 384Ch | 384Ch(67mA)<br>PAE = {(43.15mW + 3.16mW)/227.8mW}<br>* 100 = 20.33% | 384Ch(65mA)<br>PAE = {(44.87mW + 3.16mW)/110.5mW}<br>* 100 = 43.47% |
| 1011Ch | 1011Ch(69mA)<br>PAE = {(43.65mW + 3.16mW)/234.6mW}<br>* 100 = 19.95% | 1011Ch(65mA)<br>PAE = {(48.98mW + 3.16mW)/117.3mW}<br>* 100 = 44.45% |

FIG. 7

|  | channel | using load switch | using DC-DC converter |
|---|---|---|---|
| PAE % (Pout = less than 16 dBm) | 779 | 19.32 % | 42.29 % |
|  | 384 | 20.33 % | 43.47 % |
|  | 1011 | 19.95 % | 44.45 % |
| PAE % (Pout = equal to or more than 16 dBm) | 779 | 44.67 % | 40.92 % |
|  | 384 | 45.59 % | 43.62 % |
|  | 1011 | 44.02 % | 40.8 % |

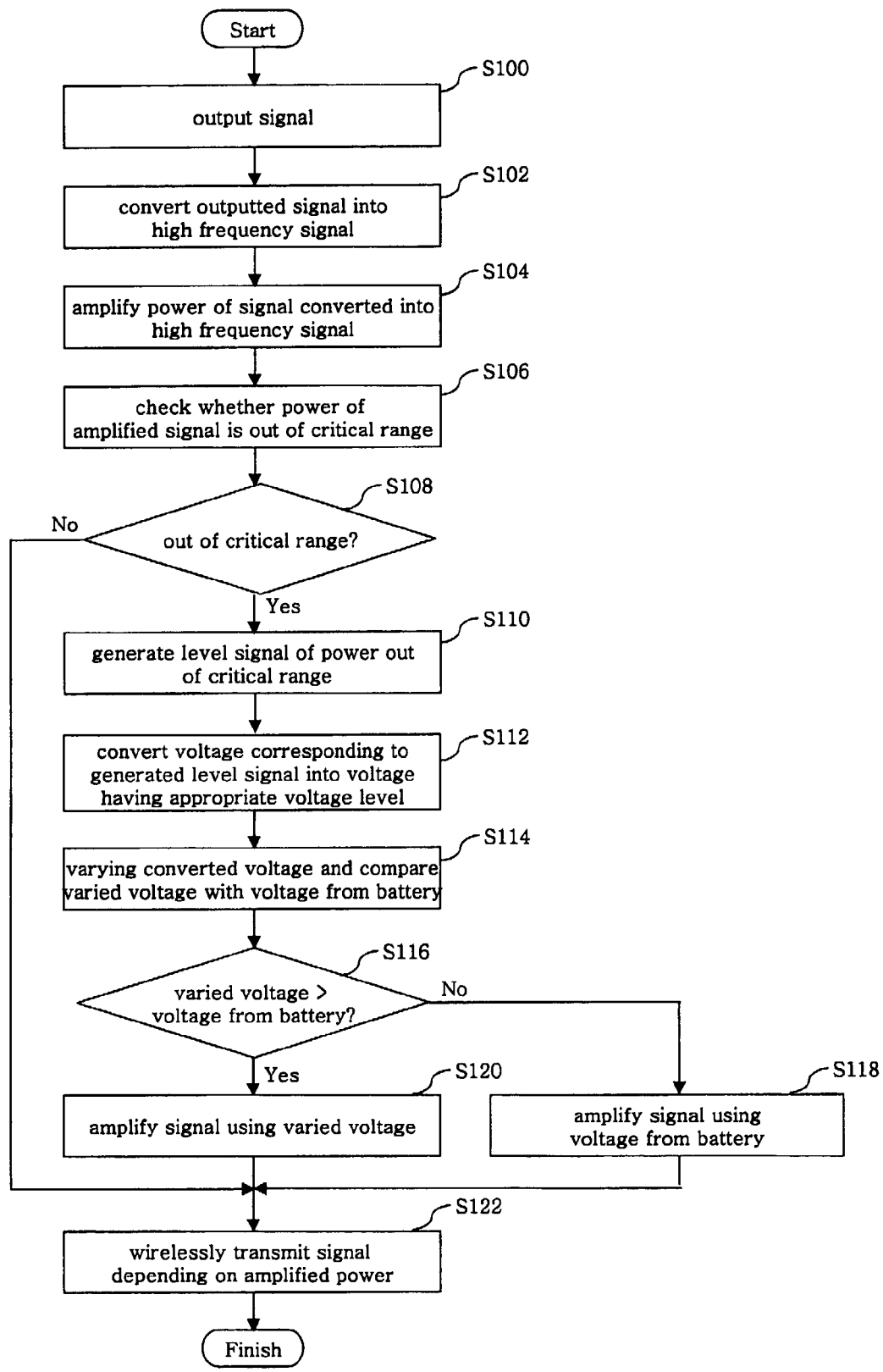

US 7,574,182 B2

MOBILE COMMUNICATIONS TERMINAL HAVING DRIVING VOLTAGE CONTROL APPARATUS AND METHOD THEREOF

This application claims priority to Korean Application Nos. 10-2005-0020738 and 10-2005-0033338 filed in Korea on Mar. 11, 2005 and Apr. 21, 2005, the entire contents of which are incorporated by reference in their entirety.

BACKGROUND OF THE INVENTION

1. Field of the Invention

The present invention relates to a driving voltage control apparatus and method, and more particularly to a mobile communication terminal having a driving voltage control apparatus for adjusting a transmission power by detecting a change in power output from a power amplifier of the mobile terminal.

2. Background of the Related Art

In general, a mobile communication terminal (i.e., a user equipment, etc.) includes a power table with power levels output for each channel. Further, the power table includes a reference power for controlling a maximum output power and the mobile communication terminal (referred to as 'terminal' hereafter) uses the reference power to control the maximum output power.

However, in the related art output power control method, a battery power of approximately 3.7V to an amplifier is applied via a load switch. Accordingly, the battery power itself is applied as a driving voltage of the power amplifier even within a frequency zone requiring a low output power, which results in a loss of efficiency of power consumption, a quick consumption of the battery and a shorter available communication time. In addition, an output power that is higher than needed interferes with other terminals, thereby lowering a communication quality of the other terminals.

SUMMARY OF THE INVENTION

Accordingly, one object of the present invention is to address the above-noted and other problems Another object of the present invention is to improve the power efficiency of a power amplifier and thus increase the amount of time a battery may be used by varying an output voltage and applying the varied output voltage to the power amplifier when the voltage output from the power amplifier exceeds a particular critical range.

To achieve these and other advantages and in accordance with one aspect of the present invention, as embodied and broadly described herein, there is provided a mobile communication terminal including a power amplifier configured to amplify a power of a received signal and wirelessly transmit the amplified signal through an antenna, a high power detector configured to determine whether the amplified power of the signal exceeds a particular critical range, a detected voltage level converter configured to convert a voltage corresponding to the output power exceeding the critical range into a voltage having a particular voltage level, and a varied driving voltage output unit configured to vary the converted voltage and apply the varied voltage to the power amplifier.

According to another aspect, the present invention provides a mobile communication method including amplifying a power of a received signal and wirelessly transmitting the amplified signal through an antenna, determining whether the amplified power of the signal exceeds a particular critical range, converting a voltage corresponding to the output power exceeding the critical range into a voltage having a particular voltage level, and varying the converted voltage and using the varied voltage in the amplification step.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 4 is a table illustrating a relation between an input/output voltage of a varied driving voltage output unit and a transmission power of a power amplifier in accordance with an embodiment of the present invention;

FIG. 5 is a graph illustrating the relation between the input/output voltage of the varied driving voltage output unit and the transmission power of the power amplifier in accordance with the embodiment of the present invention;

FIG. 6 is a table comparing an efficiency of the power amplifier in accordance with the present invention to that of the related art;

FIG. 7 is a table comparing efficiencies of the power amplifier per each channel based upon a transmission power in accordance with the present invention; and FIG. 8 is a flow chart illustrating a driving voltage control method in accordance with an embodiment of the present invention.

DETAILED DESCRIPTION OF THE INVENTION

Reference will now be made in detail to non-limiting embodiments of the present invention, examples of which are illustrated in the accompanying drawings.

The present invention increases the amount of time a battery may be used and thus increases the amount of available communication time by detecting a change in an output power output from a power amplifier and thereafter adjusting a driving voltage applied to the power amplifier by an appropriate level.

Figure 1:
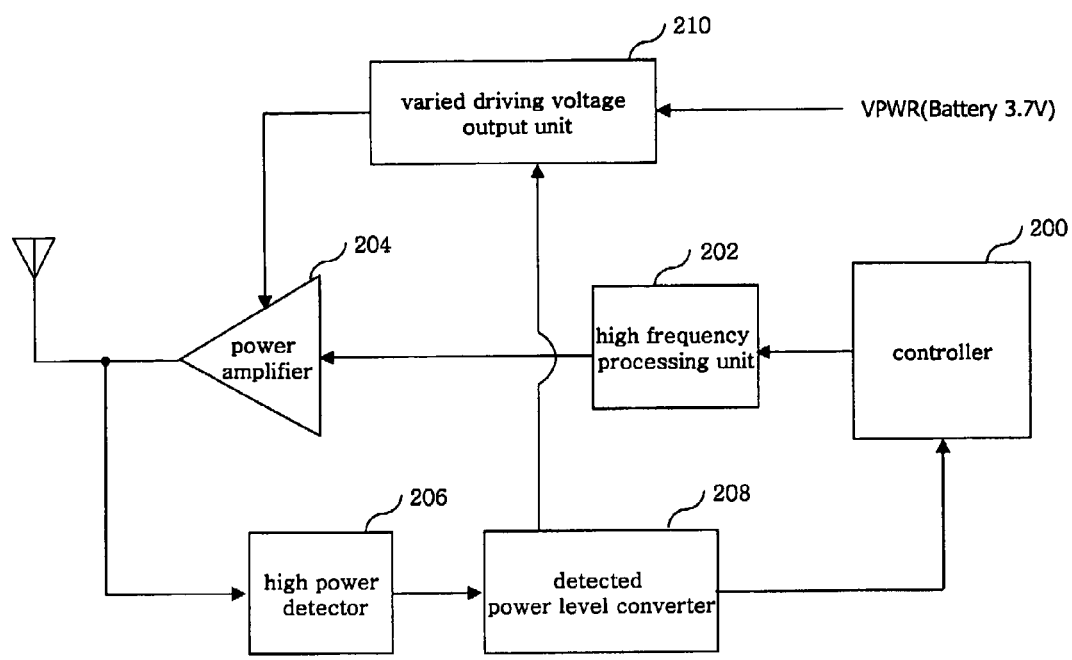
FIG. 1 is a block diagram illustrating a driving voltage control apparatus of a mobile communication terminal in accordance with one embodiment of the present invention.

Turning now to FIG. 1, which is a block diagram illustrating a driving voltage control apparatus of a mobile communication terminal in accordance with an embodiment of the present invention. As illustrated in FIG. 1, the driving voltage control apparatus includes a high frequency processing unit 202 for loading a signal output from a controller 200 onto a Radio Frequency (RF) carrier and to transmit the signal to a power amplifier 204. Further, the power amplifier 204 also receives a voltage signal via a varied driving voltage output unit 210, and amplifies the RF signal for wireless transmission through an antenna based on the received voltage signal.

The driving voltage control apparatus also includes a high power detector 206 for detecting the output power of the amplifier, generating a current output power level signal and transmitting the generated signal to a detected voltage level converter 208. The detected voltage level converter 208 converts a voltage level of the signal received from the high power detector 206 into an appropriate voltage and transmits the converted voltage to the varied driving voltage output unit 210. In addition, the varied driving voltage output unit 210 varies the voltage output from the detected voltage level converter 208 and applies the varied voltage to the power amplifier 204.

Hereinafter, an operation of the driving voltage control apparatus of the mobile communication terminal in accordance with an embodiment of the present invention will now be explained with reference to FIG. 1.

When a baseband signal output from the controller 200 is converted into a high frequency signal at the high frequency processing unit 202 and is then transmitted to the power amplifier 204, the power amplifier 204 amplifies the baseband signal by receiving a voltage output through the varied driving voltage output unit 210. The voltage output unit 210 can apply the 3.7 volt value from the battery or a voltage value corresponding to a value received from the power level converter 208. The amplified baseband signal is then wirelessly transmitted via the antenna.

Further, the power amplifier 204 generally generates too much heat to be integrated with other devices, and accordingly is typically used as a separate chip or module. The power amplifier 204 may also be formed by integrating basic bias devices together, and thus can be used without performing complicated matching processes upon being disposed in a system.

In addition, when the output power of the signal amplified by the power amplifier 204 is approximately more than a predetermined amount such as 75% of the maximum output power, the high power detector 206 generates a level signal of the amplified output power. Further, the high power detector 206 may couple the output power signal from the amplifier 204 using a directivity coupler or other type of coupling method.

The high power detector 206 then transmits the generated level signal to the detected voltage level converter 208, which uses the received level signal to change the voltage output through the power amplifier 204 into an appropriate voltage corresponding to the level signal. In more detail, the varied driving voltage output unit 210 includes a DC-DC converter which varies the received voltage (e.g., varies the received voltage to a voltage three times as great as the received voltage) and applies the varied voltage to the high power amplifier 204. The high power amplifier 204 then amplifies the signal according to the applied voltage and then wirelessly transmits the signal through the antenna. Further, if the voltage output from the varied driving voltage output unit is less than the battery voltage, the varied driving voltage output unit 210 uses a bypass mode such as a switch to apply the voltage from the battery to the power amplifier 204.

Also, as shown in FIG. 1, the high power detector 206 is not directly coupled to the varied driving voltage output unit 210, but is coupled to the varied driving voltage output unit 210 via the detected voltage level converter 208. The reason is because when the voltage output from the high power detector 206 is directly applied to the varied driving voltage output unit 210, the output unit 210 does not output a voltage having an appropriate level. Accordingly, the output level of the high power detector 206 is appropriately changed via the converter 208 and then applied to the varied driving voltage output unit 210 so as to output a voltage having an appropriate voltage level.

Further, to change the voltage output from the power amplifier 204, the detected voltage level converter 208 stores voltages to be applied to the varied driving voltage output unit 210 according to level signals output from the high power detector 206 or additionally includes a voltage dividing circuit. In more detail, FIG. 2 is a schematic showing a voltage dividing circuit included in the detected voltage level converter 208 to adjust an output voltage in accordance with an embodiment of the present invention.

Figure 2:
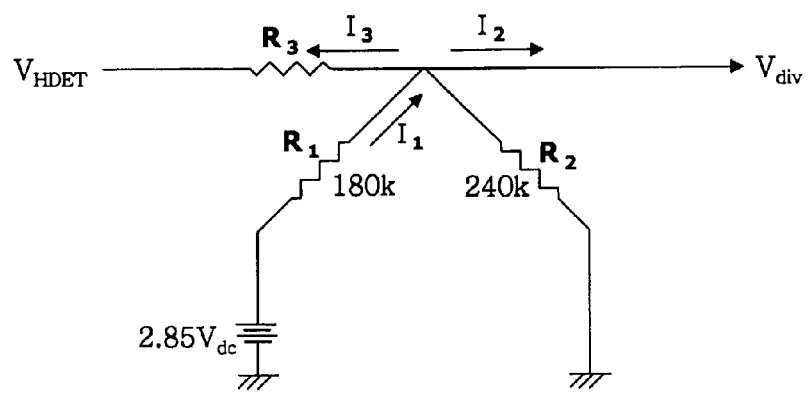
FIG. 2 is a schematic diagram illustrating a dividing circuit added to a detected voltage level converter for adjusting an output voltage in accordance with an embodiment of the present invention.

As shown in FIG. 2, the dividing circuit is constructed such that an output voltage $V_{HDET}$ of the high power detector 206 is received via a resistance $R_3$. In addition, a driving voltage $V_{dc}$ of 2.85V is applied through a resistance $R_1$ and the output voltage $V_{HDET}$ of the high power detector 206 is divided by the resistance $R_1$ and a resistance $R_2$ connected in parallel with the resistance $R_3$, and thus a divided voltage $V_{div}$ is applied to the varied driving voltage output unit 210 and the controller 200.

Here, an output range of the divided voltage $V_{div}$ can be adjusted according to values of the driving voltage $V_{dc}$ and the resistance $R_1$ through $R_3$. For converting an offset of the output voltage from 0.5V through 1.5V, as illustrated in an embodiment of FIG. 3, the resistance $R_1$ is set to '180 kΩ', the resistance $R_2$ is set to '240 kΩ', and the resistance $R_3$ is set to '560Ω', and the driving voltage $V_{dc}$ is set to 2.85V.

Thus, according to 'Kirchhoff's current law', $$I_1 = \frac{V_{dc} - V_{HDET}}{R_1}.$$

Because $$I_2 = \frac{V_{HDET}}{R_2}, \text{ and } I_3 = \frac{V_{HDET} - V_{div}}{R_3},$$

the following Formula (1) can be obtained:

$$\frac{V_{dc} - V_{HDET}}{R_1} = \frac{V_{div}}{R_2} + \frac{V_{div} - V_{HDET}}{R_3}. \qquad \text{Formula (1)}$$

Accordingly, when the divided voltage $V_{div}$ is applied to the Formula (1), the following Formula (2) can be obtained.

$$V_{div} = \frac{R_2 R_3 V_{dc} - R_1 R_2 V_{HDET}}{(R_2 R_3 + R_1 R_3 + R_1 R_2)}. \qquad \text{Formula (2)}$$

In the Formula (2), the values of $V_{dc}$, $R_1$, $R_2$ and $R_3$ are previously determined fixed values, and the output voltage $V_{HDET}$ of the high power detector 206 has variable values from 0.2V to 1.5V. If such values are applied to the Formula (2), the divided voltage $V_{div}$ can be obtained accordingly. Also, setting the offset at another voltage level range can be adjusted by varying the set values of each element.

Figure 3:
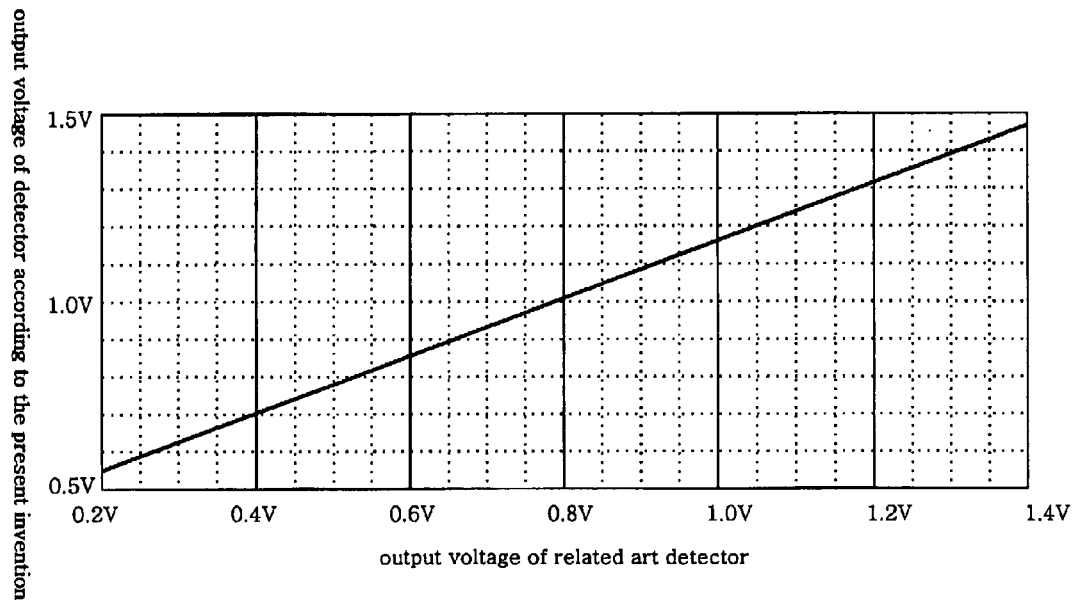
FIG. 3 is a graph illustrating a result of adjusting a voltage offset of a high power detector by simulating the dividing circuit.

Turning now to FIG. 3, which is a graph illustrating a simulation result of a voltage offset adjustment of a high power detector using the dividing circuit. As illustrated in FIG. 3, when it is assumed that an output voltage of the high power detector 206 is a voltage having a range of 0.2V through 1.4V, the output voltage of the detected voltage level converter 208 to which the dividing circuit is added is converted into a voltage having a range of 0.5V through 1.5V.

Thus, the detected voltage level converter 208 converts the output voltage of the high power detector 206 into the adjusted output voltage having a desired voltage level range and then transmits the converted voltage to the varied driving voltage output unit 210 and the controller 200. Alternatively, the voltage level converter 208 may use a table storing output voltages obtained by performing a simulation several times rather than using the diving circuit. Accordingly, the controller 200 can be stably operated corresponding to the change in transmission power.

In addition, the varied driving voltage output unit 210 uses the voltage received from the detected voltage level converter 208 as an input voltage $V_{in}$(DC-DC). The varied driving voltage output unit 210 also uses a DC-DC converter, which converts a DC voltage of the input voltage into a voltage $V_{out}$(DC-DC) approximately three times as great as the input voltage $V_{in}$(DC-DC). As discussed above, the high power detector 206 typically outputs a voltage of 0.2V through 2V proportional to the transmission power. In the present invention, the varied driving voltage output unit outputs voltage of 1.4V through 3.4V required for an operation the power amplifier 204. However, if the voltage output from the varied driving voltage output unit 210 is lower than the voltage applied from the battery, the high power detector 206 uses a bypass mode to apply the voltage from the battery to the power amplifier 204.

Next, FIG. 4 is a table illustration relation between an input/output voltage of the varied driving voltage output unit 210 and transmission power of the power amplifier 204 according to an embodiment of the present invention. As illustrated in FIG. 4, the output transmission power of the power amplifier 204 is 10 dBm when a detection voltage of 0.826V is input to the varied driving voltage output unit 210 via the detected voltage level converter 208. In this instance, the varied driving voltage output unit 210 applies a voltage of 2.501V to the power amplifier 204.

Turning now to FIG. 5, which is a graph illustrating the relation between the input/output voltage of the varied driving voltage output unit 210 and the transmission power of the power amplifier 204 illustrated in FIG. 4 in accordance with the embodiment of the present invention. As illustrated in FIG. 5, the voltage $V_{out}$(DC-DC) output from the varied driving voltage output unit 210 corresponds to a voltage approximately three times as great as the voltage $V_{in}$(DC-DC) input to the varied driving voltage output unit 210.

Next, FIG. 6 is a table comparing an efficiency of the power amplifier 204 in accordance with an embodiment of the present invention to that of the related art. As illustrated in FIG. 6, a power added efficiency (PAE) of the power amplifier 204 is increased by more than two times under 16 dBm with respect to each channel. The PAE is determined by the following formula (3):

$$PAE = \frac{RFP_{out} - RFP_{in}}{DC_{power}} \times 100\ \%. \quad \text{Formula (3)}$$

(RF $P_{out}$: output transmission power, and RF $P_{in}$: input reception power).

Turning now to FIG. 7, which is a table illustrating a comparison of efficiencies (PAEs) of a power amplifier for each channel using a load switch and using a DC-DC converter. As illustrated in FIG. 7, when the transmission power is more than or equal to 16 dBm, the PAEs for each channel are about the same when using a load switch or a DC-DC converter. However, when the transmission power is less than 16 dBm, the PAEs are more than twice when using the DC-DC converter of the present invention. Thus, a current required at a power level most frequently used in the mobile communication terminal is greatly reduced.

Further, the independent functions of the high power detector 206, the detected voltage level converter 208 and the varied driving voltage output unit 210 have been described above. However these functions may also be provided as modules of the controller 200.

Turning next to FIG. 8, which is a flowchart illustrating a driving voltage control method in accordance with an embodiment of the present invention. FIG. 1 will also be used in this description. As shown in FIG. 8, when a signal desired to be transmitted from the controller 200 (i.e., mobile station modem) is output, the high frequency processing unit 202 receives the signal, converts the received signal into a high frequency signal, and transmits the processed signal to the power amplifier 204 (S100 and S102). The power amplifier 204 then amplifies a power of the received signal using a voltage applied from the battery and transmits the amplified signal via the antenna (S104).

Further, the high power detector 206 connected to the power amplifier 204 determines whether the amplified power of the transmitted signal is outside a particular critical range (S106). The particular critical range is preset in the terminal as a range indicating what percent of the maximum output power from the power amplifier 204 is allowable.

If the amplified power of the signal is not out of the particular critical range (No in S108), the power amplifier 204 transmits the signal using the amplified power thereof through the antenna (S122). If the amplified power of the signal is outside of the particular critical range (Yes in S106), the high power detector 206 generates a level signal corresponding to the detected power that is outside the critical range (S110) and then transmits the generated level signal to the detected voltage level converter 208. The detected voltage level converter 208 converts a voltage corresponding to the generated level signal into a voltage having an appropriate voltage level using the table stored therein or the voltage dividing circuit and sends the appropriate voltage level to the varied driving voltage output unit 210 (S112).

The varied driving voltage output unit 210 varies the converted voltage received from the detected voltage level converter 208 and thereafter compares the converted voltage to the voltage output from the battery (S114). If the varied voltage is smaller than the voltage of the battery (No in S116), the voltage applied from the battery is used to amplify the signal (S118). If the varied voltage is greater than the voltage of the battery (Yes in S116), the varied driving voltage output unit 210 uses the varied voltage to amplify the signal (S120). The amplified signal is then transmitted (S122).

As described above, in the present invention, the voltage output from the power level converter 208 is used to control the output voltage of the varied driving voltage output unit 210, and thus the voltage applied to the power amplifier 204 is adjusted based on the voltage level signal received from the converter 208. Thus, the power efficiency is effectively increased for each channel as can be seen in the simulation result. In addition, the power efficiency is increased by more than two times to the maximum at the power level less than 16 dBm which is frequently used in mobile communication terminals. Therefore, the current consumption of the terminal can be reduced, which results in an increase in communication time.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A mobile communication terminal comprising:
   a power amplifier configured to amplify a power of a received signal and wirelessly transmit the amplified signal through an antenna;
   a power detector configured to determine whether the amplified power of the signal exceeds a particular critical range;
   a detected voltage level converter configured to convert a voltage corresponding to the output power exceeding the critical range into a voltage having a particular voltage level; and
   a varied driving voltage output unit configured to vary the converted voltage and apply the varied voltage to the power amplifier,
   wherein the varied driving voltage output unit varies a voltage to the power amplifier that is a predetermined number of times greater than the voltage input from the detected voltage level converter,
   wherein the varied driving voltage output unit includes a comparing module configured to compare the varied voltage that is the predetermined number of times greater than the voltage input from the detected voltage level converter with a voltage applied from a battery, and
   wherein if the voltage that is the predetermined number of times greater than the voltage input from the detected voltage level converter is smaller than the voltage applied form the battery, the comparing module applies the voltage from the battery to the power amplifier.

2. The terminal of claim 1, further comprising a controller configured to receive the voltage level of the converted voltage from the detected voltage level converter.

3. The terminal of claim 2, wherein the detected voltage level converter applies the converted voltage to both the varied driving voltage output unit and the controller.

4. The terminal of claim 1, wherein the power detector includes a module configured to determine the amplified power of the signal.

5. The terminal of claim 1, wherein the particular critical range includes a range that the amplified power of the signal is more than 75% of a maximum output power.

6. The terminal of claim 1, wherein the detected voltage level converter includes a voltage dividing circuit to convert the voltage corresponding to the output power exceeding the critical range into the voltage having the particular voltage level.

7. The terminal of claim 6, wherein the voltage dividing circuit applies a voltage to the varied driving voltage output unit that is based on an output voltage of the power detector and a driving voltage of the voltage dividing circuit.

8. The terminal of claim 6, wherein the converted voltage having the particular voltage level corresponds to a voltage level desired by the varied driving voltage output unit.

9. The terminal of claim 1, wherein the detected voltage level converter includes a table used to convert the voltage corresponding to the output power exceeding the critical range into the voltage having the particular voltage level.

10. The terminal of claim 9, wherein the converted voltage from the table having the particular voltage level corresponds to a voltage level desired by the varied driving voltage output unit.

11. The terminal of claim 1, wherein the varied driving voltage output unit varies a DC voltage output from the detected voltage level converter into a DC voltage having a different level, and applies the DC voltage level having the different level to the power amplifier.

12. The terminal of claim 1, wherein the power detector, the detected voltage converter and the varied driving voltage output unit are included as modules within a controller.

13. A mobile communication method comprising:
    amplifying a power of a received signal and wirelessly transmitting the amplified signal through an antenna;
    determining whether the amplified power of the signal exceeds a particular critical range;
    converting a voltage corresponding to the output power exceeding the critical range into a voltage having a particular voltage level; and
    varying the converted voltage and using the varied voltage in the amplifying step,
    wherein the varying step varies a voltage used by the amplifying step that is a predetermined number of times greater than the voltage input from the converting step,
    wherein the varying step compares the varied voltage that is the predetermined number of times greater than the voltage input from the converting step with a voltage applied from a battery, and
    wherein if the voltage that is predetermined number of times greater than the voltage input from the converting step is smaller than the voltage applied form the battery, the amplifying step uses the voltage from the battery.

14. The method of claim 13, wherein the particular critical range includes a range that the amplified power of the signal is more than 75% of a maximum output power.

15. The method of claim 13, wherein the converting step uses a voltage dividing circuit to convert the voltage corresponding to the output power exceeding the critical range into the voltage having the particular voltage level.

16. The method of claim 15, wherein the converted voltage having the particular voltage level corresponds to a voltage level desired by the varying step.

17. The method of claim 13, wherein the converting step uses a table to convert the voltage corresponding to the output power exceeding the critical range into the voltage having the particular voltage level.

18. The method of claim 17, wherein the converted voltage from the table having the particular voltage level corresponds to a voltage level desired by the varying step.

19. The method of claim 13, wherein the varying step varies a DC voltage output from the converting step into a DC voltage having a different level, and the amplifying step uses the DC voltage level having the different level.

20. A mobile communication terminal, comprising:
    a power amplifier configured to amplify a power of a received signal and wirelessly transmit the power-amplified signal through an antenna;
    a power detector configured to detect whether the amplified power of the signal exceeds a particular critical range;
    a voltage level converter configured to convert the voltage detected by the power detector into a certain voltage having a particular voltage level using one of a table having different voltages verses certain voltages having particular voltage levels or a distribution circuit to change the voltage detected by the power detector into the certain voltage having the particular voltage level; and a varied driving voltage output unit configured to vary the certain voltage having the particular voltage level output by the voltage level converter into a new voltage by multiplying the certain voltage having the particular voltage level output by the voltage level converter by a specific multiple, wherein the varied driving voltage output unit is further configured to compare a value of the new voltage with a value of a voltage applied from a battery, to apply the voltage from the battery to the power amplifier, if the value of the new voltage is smaller than the value of the voltage applied from the battery, and to apply the new voltage to the power amplifier if the value of the new voltage is larger than the value of the voltage applied from the battery.

21. A mobile communication method comprising:

amplifying a power of a received signal and wirelessly transmitting the power-amplified signal through an antenna;

detecting whether the amplified power of the signal exceeds a particular critical range;

converting the voltage detected by the detecting step into a certain voltage having a particular voltage level using one of a table having different voltages verses certain voltages having particular voltage levels or a distribution circuit to change the voltage detected by the detecting step into the certain voltage having the particular voltage level;

varying the certain voltage having the particular voltage level output by the detecting step into a new voltage by multiplying the certain voltage having the particular voltage level output by the detecting step by a specific multiple; and comparing a value of the new voltage with a value of a voltage applied from a battery, applying the voltage from the battery to the power amplifier, if the value of the new voltage is smaller than the value of the voltage applied from the battery, and applying the new voltage to the power amplifier if the value of the new voltage is larger than the value of the voltage applied from the battery.

* * * * *